(12) United States Patent
Jain et al.

(10) Patent No.: US 10,587,044 B2
(45) Date of Patent: Mar. 10, 2020

(54) FLIP-CHIP BEAMFORMING INTEGRATED CIRCUIT WITH INTEGRAL THERMAL MASS

(71) Applicant: Anokiwave, Inc., San Diego, CA (US)

(72) Inventors: Vipul Jain, Irvine, CA (US); Noyan Kinayman, Harvard, MA (US); Robert J. McMorrow, Concord, MA (US); Kristian N. Madsen, Napa, CA (US); Shamsun Nahar, San Diego, CA (US); Nitin Jain, San Diego, CA (US)

(73) Assignee: Anokiwave, Inc., San Diego, CA (US)

( * ) Notice: Subject to any disclaimer, the term of this patent is extended or adjusted under 35 U.S.C. 154(b) by 109 days.

(21) Appl. No.: 15/792,484

(22) Filed: Oct. 24, 2017

(65) Prior Publication Data

US 2018/0115356 A1 Apr. 26, 2018

Related U.S. Application Data

(60) Provisional application No. 62/412,122, filed on Oct. 24, 2016.

(51) Int. Cl.
*H01Q 3/36* (2006.01)
*H05K 1/02* (2006.01)
(Continued)

(52) U.S. Cl.
CPC .......... *H01Q 3/36* (2013.01); *H01L 23/3672* (2013.01); *H01L 23/49503* (2013.01); *H01L 23/49541* (2013.01); *H01L 23/49827* (2013.01); *H01L 23/49838* (2013.01); *H01L 23/562* (2013.01); *H01L 23/564* (2013.01);
(Continued)

(58) Field of Classification Search
CPC ........ H01Q 21/22; H01Q 21/065; H01Q 3/26; H01Q 3/34; H04B 7/0617; H04B 7/0626; H04B 7/0639
See application file for complete search history.

(56) References Cited

U.S. PATENT DOCUMENTS 5,136,271 A  8/1992  Nishioka et al.
5,448,250 A  9/1995  Day
(Continued)

FOREIGN PATENT DOCUMENTS

WO  WO 2017/078851 A2  5/2017

OTHER PUBLICATIONS

Bailey, *General Layout Guidelines for RF and Mixed-Signal PCBs*, Maxim Integrated, Tutorial 5100, 10 pages, Sep. 14, 2011.
(Continued)

*Primary Examiner* — Hoang V Nguyen
(74) *Attorney, Agent, or Firm* — Nutter McClennen & Fish LLP

(57) ABSTRACT

A beamforming integrated circuit system for use in a phased array has a microchip with RF circuitry, a bottom surface, and a plurality of interfaces electrically connected with the RF circuitry. The plurality of interfaces includes a plurality of static interfaces and a plurality of RF interfaces. The plurality of static interfaces are on the bottom surface of the microchip and adjacent to each other. The plurality of RF interfaces are also on the bottom surface of the microchip, but radially outward of the plurality of static interfaces. The microchip is configured to be flip chip mounted.

20 Claims, 7 Drawing Sheets

(51) Int. Cl.
| | |
|---|---|
| H01L 23/367 | (2006.01) |
| H01L 23/495 | (2006.01) |
| H01L 23/498 | (2006.01) |
| H01L 23/00 | (2006.01) |
| H01L 23/58 | (2006.01) |
| H01L 23/66 | (2006.01) |
| H01P 3/02 | (2006.01) |
| H01P 3/08 | (2006.01) |
| H01Q 3/26 | (2006.01) |
| H04B 7/06 | (2006.01) |
| H04L 27/26 | (2006.01) |

(52) U.S. Cl.
CPC ............ *H01L 23/585* (2013.01); *H01L 23/66* (2013.01); *H01L 24/16* (2013.01); *H01L 24/48* (2013.01); *H01P 3/026* (2013.01); *H01P 3/08* (2013.01); *H01P 3/081* (2013.01); *H01Q 3/26* (2013.01); *H04B 7/0617* (2013.01); *H04B 7/0626* (2013.01); *H04B 7/0639* (2013.01); *H04L 27/2607* (2013.01); *H04L 27/2634* (2013.01); *H05K 1/0206* (2013.01); *H01L 2223/6627* (2013.01); *H01L 2223/6677* (2013.01); *H01L 2224/0603* (2013.01); *H01L 2224/16225* (2013.01); *H01L 2224/48245* (2013.01); *H01L 2924/00014* (2013.01); *H05K 2201/066* (2013.01)

(56) References Cited

U.S. PATENT DOCUMENTS

| | | | |
|---|---|---|---|
| 5,724,666 | A | 3/1998 | Dent |
| 7,087,993 | B2 | 8/2006 | Lee |
| 7,129,568 | B2 | 10/2006 | Lee et al. |
| 7,719,110 | B2 | 5/2010 | Zhao et al. |
| 8,558,398 | B1 | 10/2013 | Seetharam |
| 8,866,283 | B2 | 10/2014 | Chen et al. |
| 9,640,494 | B1 | 5/2017 | Sharma |
| 2002/0146200 | A1 | 10/2002 | Kudrle et al. |
| 2003/0111738 | A1 | 6/2003 | Buschbom |
| 2005/0017352 | A1 | 1/2005 | Lee |
| 2005/0082645 | A1 | 4/2005 | Lee et al. |
| 2005/0098860 | A1 | 5/2005 | Lai et al. |
| 2005/0225481 | A1 | 10/2005 | Bonthron |
| 2006/0006505 | A1 | 1/2006 | Chiang et al. |
| 2006/0223466 | A1 | 10/2006 | Behzad |
| 2008/0291115 | A1 | 11/2008 | Doan et al. |
| 2009/0153428 | A1 | 6/2009 | Rofougaran et al. |
| 2009/0256752 | A1 | 10/2009 | Akkermans et al. |
| 2011/0074047 | A1* | 3/2011 | Pendse ............... H01L 24/09 257/782 |
| 2011/0198742 | A1 | 8/2011 | Danno et al. |
| 2012/0313219 | A1 | 12/2012 | Chen et al. |
| 2013/0050055 | A1 | 2/2013 | Paradiso et al. |
| 2013/0187830 | A1 | 7/2013 | Warnick et al. |
| 2014/0348035 | A1 | 11/2014 | Corman et al. |
| 2016/0049723 | A1* | 2/2016 | Baks ............... H01L 23/49827 343/848 |
| 2016/0233141 | A1* | 8/2016 | Hirobe ............. H01L 23/3675 |
| 2016/0248157 | A1 | 8/2016 | Rao et al. |
| 2016/0300812 | A1* | 10/2016 | Chen ................. H01L 24/49 |
| 2017/0237180 | A1 | 8/2017 | Corman et al. |

OTHER PUBLICATIONS

Entesari et al., *A Low-Loss Microstrip Surface-Mount K-Band Package*, Proceedings of the 36$^{th}$ European Microwave Conference, Manchester, UK, IEEE, pp. 1763-1766, Sep. 10-15, 2006.

Ismail, *Introduction to RF CMOS IC Design for Wireless Applications*, Analog VLSI Lab, The Ohio State University, 117 pages, undated.

Jain, *Layout Review Techniques for Low Power RF Designs*, Application Note AN098, Texas Instruments, 14 pages, 2012.

Maxim, *5GHz, 4-Channel MIMO Transmitter*, MAX2850, Maxim Integrated Products, Inc., 33 pages, 2010.

Min et al., *DC—50 GHz Low-Loss Wafer-Scale Package for RF MEMS*, Proceedings of the 34$^{th}$ European Microwave Conference, Amsterdam, The Netherlands, IEEE, pp. 1289-1291, Oct. 12-14, 2004.

Silicon Labs, *Layout Design Guide for the Si4455/435x RF ICs*, AN685, Silicon Laboratories, 22 pages, 2014.

International Search Report and Written Opinion for Application No. PCT/US 17/58117, 20 pages, (United States Patent and Trademark Office dated Mar. 1, 2018).

* cited by examiner

FLIP-CHIP BEAMFORMING INTEGRATED CIRCUIT WITH INTEGRAL THERMAL MASS

PRIORITY

This patent application claims priority from provisional U.S. patent application No. 62/412,122, filed Oct. 24, 2016, entitled, "HIGH PERFORMANCE PACKAGED MICROCHIP," and naming Vipul Jain, Noyan Kinayman, Robert McMorrow, Kristian Madsen, Shamsun Nahar, and Nitin Jain as inventors, the disclosure of which is incorporated herein, in its entirety, by reference.

FIELD OF THE INVENTION

Various embodiments of the invention generally relate to high-frequency microchips and, more particularly, various embodiments of the invention relate to thermal management of beamforming microchips for use with phased arrays.

BACKGROUND OF THE INVENTION

Active electronically steered antenna systems ("AESA systems," a type of "phased array system") or active antenna systems form electronically steerable beams for a wide variety of radar and communications systems. To that end, AESA systems typically have a plurality of beam-forming elements (e.g., antennas) that transmit and/or receive energy so that such energy can be coherently combined (i.e., in-phase and amplitude). This process is referred to in the art as "beam forming" or "beam steering." Specifically, for transmission, many AESA systems implement beam steering by providing various RF phase shift and gain settings. The phase settings and gain weights together constitute a complex beam weight between each beam-forming element. For a signal receiving mode, many AESA systems use a beamforming or summation point.

To achieve beam-forming using an antenna array, each antenna element is connected to a semiconductor integrated circuit generally referred to as a "beam-forming IC." This microchip/integrated circuit may have a number of sub-circuit components implementing various functions. For example, those components may implement phase shifters, amplitude control modules or a variable gain amplifier (VGA), a power amplifier, a power combiner, a digital control, and other electronic functions. Such an integrated circuit is packaged to permit input and output radio frequency (RF) connections.

Undesirably, some interfaces to the integrated circuit can interfere with other local interfaces or metal in its body (e.g., a seal ring), causing phase and amplitude modulation. In addition, due to inefficient packaging configurations, the integrated circuit often operates at higher than preferred temperatures.

SUMMARY OF VARIOUS EMBODIMENTS

In accordance with one embodiment of the invention, a beamforming integrated circuit system for use in a phased array has a microchip with RF circuitry, a bottom surface, and a plurality of interfaces. At least one of the plurality of interfaces is/are electrically connected with the RF circuitry (i.e., some may not, such as one or more of the below noted static interfaces). The plurality of interfaces includes a plurality of static interfaces and a plurality of RF interfaces. The plurality of static interfaces are on the bottom surface of the microchip and adjacent to each other. The plurality of RF interfaces are also on the bottom surface of the microchip, but radially outward of the plurality of static interfaces. The microchip is configured to be flip chip mounted.

To increase surface area for thermal conduction, the plurality of static interfaces may form a two dimensional array of static interfaces. Moreover, the plurality of RF interfaces may be between the edge and the plurality of static interfaces. For example, the plurality of RF interfaces may be adjacent to the edge of the microchip.

The plurality of static interfaces may include a plurality of ground interfaces. In other embodiments, however, the plurality of static interfaces may include a plurality of power interfaces (e.g., the rail voltage). The plurality of RF interfaces may circumscribe the plurality of static interfaces.

The system also may include a first ground interface and a second ground interface, while the plurality of RF interfaces may include a given RF interface with a first side and a second side. In some embodiments, the first ground interface is adjacent to the first side of the given RF interface, and the second ground interface is adjacent to the second side of the given RF interface.

The system also may include a printed circuit board with a top surface having an exposed metal layer conductively thermally coupled to a plurality of vias. The microchip thus may be flip-chip mounted to the printed circuit board onto the exposed metal layer to couple the plurality of ground interfaces with the plurality of vias in the printed circuit board. To improve thermal management, the system also may have a heat sink coupled with the printed circuit board and conductively thermally coupled with the plurality of vias. The exposed metal layer forms a thermal mass to conduct heat from the microchip toward the heat sink.

Some embodiments also have a material ring circumscribing the static interfaces and the RF interfaces, and at least one RF ground path coupled with the ring. Moreover, illustrative embodiments operate at high frequencies. For example, the RF circuitry may operate at frequencies of between about 5 GHz and 300 GHz.

In accordance with another embodiment, a beamforming system includes a printed circuit board with a top surface having a metal layer, and a plurality of vias conductively thermally coupled with the metal layer. The system also has a microchip with high frequency RF circuitry, an edge, and a bottom surface. The bottom surface of the microchip is flip-chip mounted with the top surface of the printed circuit board. In illustrative embodiments, the bottom surface of the microchip has a plurality of interfaces electrically connected with the RF circuitry, and that plurality of interfaces includes a plurality of static interfaces and a plurality of RF interfaces. The plurality of static interfaces are adjacent to each other, while the plurality of RF interfaces are adjacent to the edge of the microchip. The plurality of static interfaces are conductively thermally coupled with the RF circuitry, the metal layer, and the plurality of vias.

In accordance with other embodiments, a method of forming an RF beamforming system provides a printed circuit board with a top surface having a metal layer. The printed circuit board also has a plurality of vias conductively thermally coupled with the metal layer. The method then flip-chip mounts a microchip on the printed circuit board. Among other things, the microchip has high frequency RF circuitry, an edge, and a bottom surface. More specifically, the bottom surface of the microchip has a plurality of interfaces electrically connected with the RF circuitry. The plurality of interfaces includes a plurality of static interfaces and a plurality of RF interfaces. The plurality of static interfaces are adjacent to each other, while the plurality of RF interfaces are adjacent to the edge of the microchip. The method flip-chip mounts the microchip in a manner that conductively thermally couples the plurality of static interfaces with the RF circuitry, the metal layer, and the plurality of vias, thus forming a conductive thermal path configured to conduct heat from the microchip during use.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a high-frequency microchip system positions interface pads on a flip-chip mounted microchip to optimize thermal performance. To that end, selected interface pads of the microchip may be grouped away from the periphery of the microchip to thermally communicate with a heat sink on a printed circuit board to which the microchip is flip-chip mounted. Those interface pads may include ground pads, or power pads (e.g., receiving input voltage, such as Vdd).

In addition or alternatively, the microchip also configures its seal ring and/or crackstop ring to minimize RF interference with its signal pads. To that end, the rings both preferably are RF grounded in multiple locations as a function of anticipated wavelengths of signals processed by the microchip. More specifically, one or both of the rings preferably are grounded in multiple locations about their peripheries in a manner that effectively RF grounds the ring(s) for anticipated signal wavelengths. To further mitigate noise, the high frequency signal pads preferably have a ground pad adjacent to two of its sides.

In either case, the microchip may use a wafer level chip-scale package to flip-chip bond with the noted printed circuit board. Other embodiments, however, may use a package level package, such as a quad flat no-leads package. Details of illustrative embodiments are discussed below.

Figure 1:
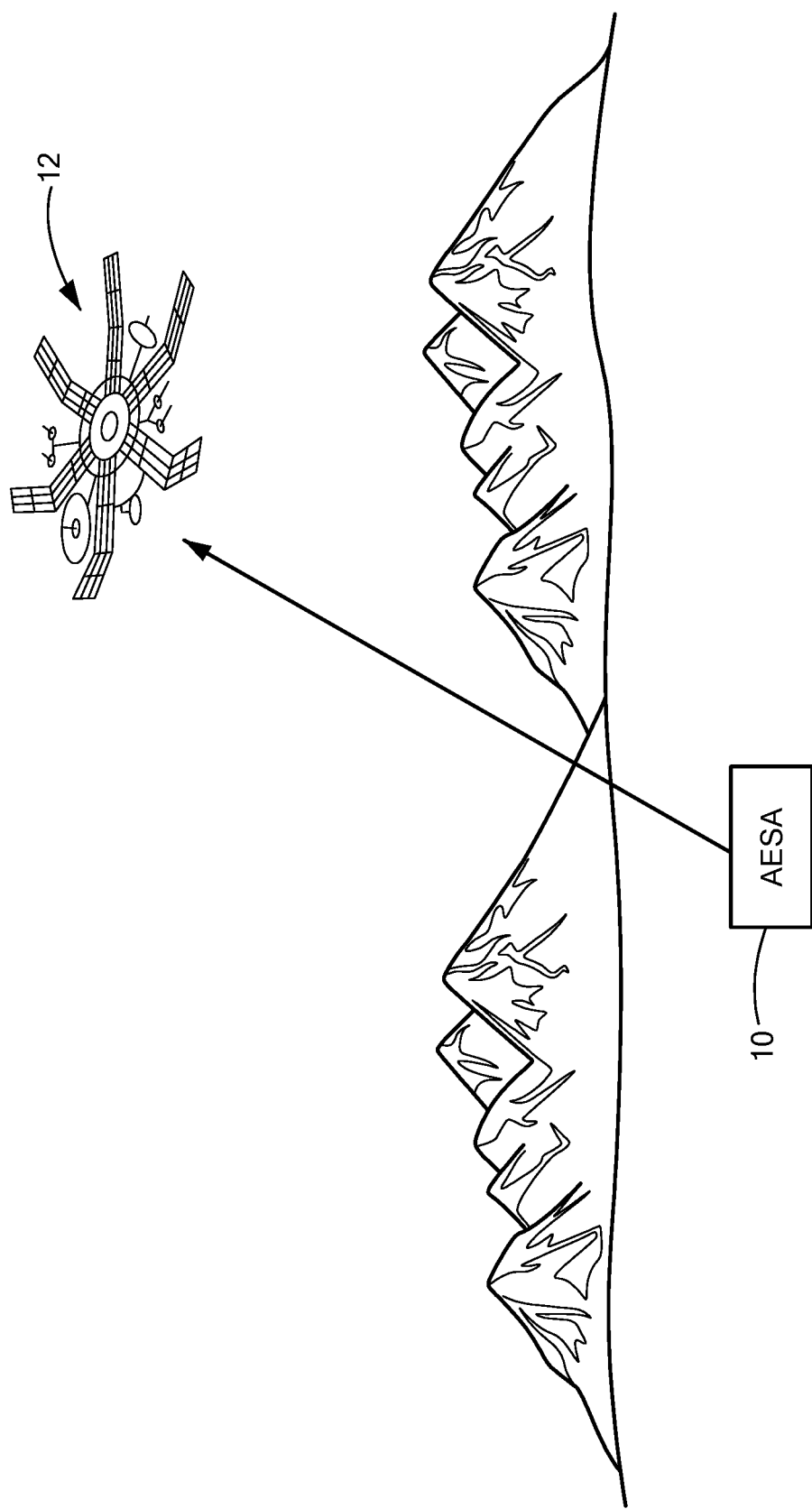
FIG. 1 schematically shows an active electronically steered antenna system ("AESA system") that can implement an AESA microchip configured accordance with illustrative embodiments of the invention.

FIG. 1 schematically shows an active electronically steered antenna system ("AESA system 10") configured in accordance with illustrative embodiments of the invention and communicating with an orbiting satellite 12. A phased array implements the primary functionality of the AESA system 10. Specifically, as known by those skilled in the art, the phased array forms one or more of a plurality of electronically steerable beams that can be used for a wide variety of applications. As a satellite communication system, for example, the AESA system 10 preferably is configured operate at one or more satellite frequencies. Among others, those frequencies may include the Ka-band, Ku-band, and/or X-band.

The satellite communication system may be part of a cellular network operating under a known cellular protocol, such as the 3G, 4G, or 5G protocols. Accordingly, in addition to communicating with satellites 12, the AESA system 10 may communicate with earth-bound devices, such as smartphones or other mobile devices, using any of the 3G, 4G, or 5G protocols. As another example, the satellite communication system may transmit/receive information between aircraft and air traffic control systems. Of course, those skilled in the art may use the AESA system 10 (implementing the noted phased array) in a wide variety of other applications, such as broadcasting, optics, radar, etc. Some embodiments may be configured for non-satellite communications and instead communicate with other devices, such as smartphones (e.g., using 4G or 5G protocols). Accordingly, discussion of communication with orbiting satellites 12 is not intended to limit all embodiments of the invention.

For additional information regarding various embodiments of the AESA system 10, see co-pending U.S. patent application Ser. No. 15/267,689, filed Sep. 16, 2016, and assigned to Anokiwave, Inc. of San Diego, Calif., the disclosure of which is incorporated herein, in its entirety, by reference.

Figure 2:
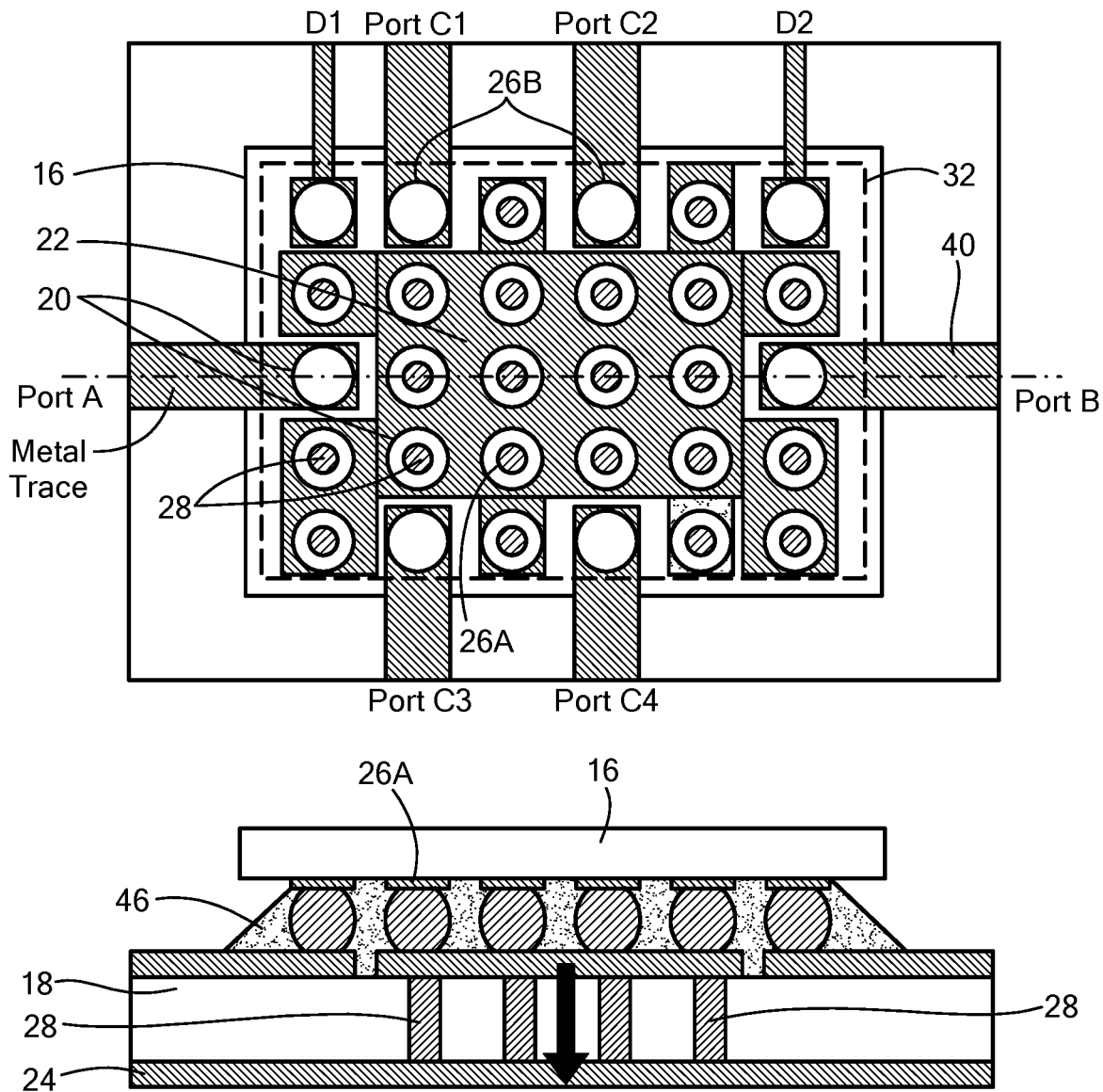
FIG. 2 schematically shows a plan view of an AESA microchip having a wafer level package, as well as a cross-sectional view of the same microchip flip-chip mounted on a printed circuit board, in accordance with illustrative embodiments of the invention.

The AESA system 10 of FIG. 1 uses beamforming microchips to control, transmit, and/or receive RF signals. FIG. 2 schematically shows upper and lower views of a microchip system 14 implemented in an AESA system 10 and configured in accordance with one embodiment of the invention. Specifically, the upper view shows the bottom surface of a microchip 16 having RF circuitry (not shown). This view is considered to be the bottom surface because when it is mounted to a printed circuit board 18 (lower view), it faces downwardly. Reference to that surface as a top or bottom surface is for convenience only and not intended to limit various embodiments.

In addition to showing features of the top surface of the microchip 16, however, this upper view also shows features of the printed circuit board 18 (e.g., metal 22) as well as solder balls 20. The lower view shows a cross-sectional view of the microchip 16 flip-chip mounted on the prior noted printed circuit board 18, which has top-side metal 22 and a bottom side heat sink or heat spreader (collectively referred to as a "heat sink 24"). The heat sink 24 can be any of a variety of heat sinks known in the art. Some embodiments may augment the cooling effect by using a fan (not shown) to convectively cool the heat sink 24.

The drawings have text calling out various features of the microchip 16 and the printed circuit board 18. Specifically, the printed circuit board 18 has a plurality of metal lines/ports on its top surface for communicating signals with the microchip 16. Among others, those lines include digital communication lines D1 and D2, and RF lines, shown as Ports A, B, C1, C2, C3, and C4. Ports A, B, C1-C4, for example, may carry high frequency signals to communicate with the satellite 12 of FIG. 1. Those signals may include microwave-wave frequencies (300 MHz and 30 GHz) and/or millimeter-wave (30 GHz to 300 GHz) frequencies. Each of these lines couples with microchip pads (generally referred to using reference number "26") through the solder balls 20 (or other conductor, such as copper pillars) between the microchip pads 26 and those lines. Those microchip pads 26 that communicate RF signals, shown in the lower view because they are blocked in the figures by the PCB metal 22, may be referred to as "signal pads 26B."

The printed circuit board 18 has a plurality of vias 28 extending through its body to thermally and electrically couple between the noted heat sink 24 on the bottom PCB surface, and a large metal pad 22 (or, alternatively, a plurality metal pads 22) on the top PCB surface. FIG. 2 shows the vias 28 in the upper view as circles with several interior hatched angled lines. The upper view also shows those vias 28 as within larger circles having a dotted pattern—solder balls 20. Of course, as shown in the lower view, the solder balls 20 are physically above the vias 28 from the perspective of the figures.

In accordance with illustrative embodiments of the invention, a set of static pads 26A (i.e., pads that transmit a static signal or no signal, such as a DC power signal or ground—they do not transmit RF signals) are concentrated in an inner region of the top microchip surface. In illustrative embodiments, those static pads 26A are ground pads, which also will be referred to using reference number "26A." FIG. 2, for example, shows a 4×3 array/set of 12 ground pads 26A in that inner region. Indeed, various embodiments may have more or fewer than 12 ground pads 26A. Accordingly, like other features shown in this figure, specific locations and numbers of certain elements are illustrative and not intended to limit all embodiments.

This inner set of ground pads 26A is circumscribed by a plurality of other interface pads 26 on the microchip 16. These other interface pads 26 may include one or both signal pads 26B (e.g., for communicating RF signals) and/or additional ground pads 26A. Accordingly, some or all of the signal pads 26 on the microchip 16 preferably have no other pads 26A or 26B between it and at least one edge of the microchip 16 and thus, are considered to be "adjacent" to the edge of the microchip 16. It should be pointed out that, as shown in the figures, circumscribing does not imply that there is a continuous barrier of interface pads 26 around the inner set of pads 26A.

The inner ground pads 26A preferably do not electrically connect with other, more peripheral/radially outwardly positioned ground pads 26A and 26B through the top surface metal 22 of the printed circuit board 18. In a similar manner, the inner ground pads 26A may not electrically connect to the RF circuitry. Instead, as discussed below, these ground pads 26A simply conduct heat away from the region near the RF circuitry or the RF circuitry itself. They do not ground a circuit. Other embodiments, however, couple these ground pads 26A with the RF circuitry.

Some or all of the RF signal pads 26B preferably have a ground pad 26A adjacent to two of its opposing sides. For example, Port C2 has a ground pad 26A adjacent to its right side, and another ground pad 26A adjacent to its left side. No other pads 26A or 26B are between Port C2 and those two ground pads 26A. The inventors recognized that using a configuration such as this further mitigates noise and cross-talk between RF interfaces/pads 26B at high frequencies, such as in the microwave and millimeter-wave frequencies.

Other embodiments may position a third ground pad adjacent to another side of the signal pad, or position two ground pads 26A at a different angular position relative to the other ground pad. For example, rather than being 180 spaced apart (e.g., like the ground pads 26A around Port C2), some embodiments may angularly space the two ground ports to be 120 degrees apart or 90 degrees apart. These configurations of signal pads 26B and ground pads 26A may be generally referred to as a "GSG pad arrangement."

High frequency RF circuitry undesirably generates a lot of waste heat. If not properly managed, this waste heat can affect performance, and even damage the microchip 16. The inventors recognized that heat generated by the functional elements of the microchip 16 (e.g., the RF circuitry) may be routed through the printed circuit board 18 and to the heat sink 24 through the vias 28. Moreover, rather than spreading them out across the printed circuit board 18, these thermal management ground vias 28 can be clustered, as shown in FIG. 2, to produce a relatively large thermal mass that more readily cools the microchip circuitry. These vias 28 can be filled or unfilled.

When coupled with the printed circuit board 18, the microchip ground pads 26A contact the solder balls 20, which in turn contact top surface, exposed PCB metal 22 on the printed circuit board 18. This top surface PCB metal 22 may be a single mass, or a single interrupted, discontinuous mass of surface metal 22. Accordingly, the inventors clustered the top surface PCB metal 22 and vias 28 in a central location and in a relatively large volume to more easily route the heat away from the functional elements. This cluster produces the noted large thermal mass that more readily conducts heat to the heat sink 24. Two or more adjacent ground vias 28 in the interior of the printed circuit board 18 may be considered to be a "cluster." In a similar manner, two or more adjacent ground pads 26A on the interior of the microchip 16 also may be considered to be a cluster. These clusters may have 3, 4, 5, 6 or some other number of elements and preferably is in the form of a two-dimensional array (e.g., as shown in FIG. 2).

Simulations of various embodiments implementing similar designs have shown a significantly lower temperature rise that those of prior art microchip systems without such a cluster. One simulation, for example, showed a 10 degree temperature rise in a microchip system 14 implementing an embodiment of the invention, while a prior art microchip system showed a 60-70 degree temperature rise. Indeed, these results are preliminary and could change depending on the situation and implementation.

The microchip 16 also has a plurality of rings 32 that both (i.e., together) protect the functional elements of the microchip 16 and minimize cracking during the fabrication process. Specifically, the microchip 16 has a seal ring 32 circumscribing the microchip pads 26, and a crackstop ring 32 radially outward of the seal ring. Both rings 32 preferably are formed from metal and extend from the surface into the microchip 16. Although referred to as "rings," they are not necessarily circular or elliptical. For example, FIG. 2 shows the rings 32 as being rectangular. Other embodiments may be square, pentagonal, irregularly shaped, or some other shape. Some embodiments may have a break in one or both of the rings 32. As such, the rings 32 would be discontinuous but still circumscribe pads 26 and the RF circuitry.

More particularly, as known by those skilled in the art, during the wafer dicing process, the microchip 16 can develop a crack that can degrade and possibly render the microchip 16 nonfunctional. The crackstop ring 32 therefore acts as a barrier to mitigate such a crack from permeating into the microchip 16. Preferably, the crackstop ring 32 acts as a physical block to prevent a crack from extending radially inwardly into the microchip 16 (i.e., beyond the crackstop ring).

In addition, as also known by those skilled in the art, contaminants also can adversely affect the functional elements of the microchip 16. Accordingly, the seal ring 32 acts as a substantial barrier to mitigate or prevent contaminants, such as ions and moisture, from reaching the functional blocks of the microchip 16 (e.g., to protect the RF circuitry).

One or both of the two rings 32 may be DC grounded, but often, in the prior art, they may not be RF grounded (i.e., grounded with regard to RF signals). Accordingly, one or both of the prior art rings may be considered to be RF floating. This is particularly problematic with an AESA microchip 16 (e.g., a microchip 16 used in the AESA system 10 of FIG. 1) because one or both floating rings can interfere with the incoming or outgoing high-frequency RF signals in the lines of the PCB and the RF pads 26B of the microchip 16. Among other frequencies, the rings undesirably can produce resonances at microwave and millimeter-wave frequencies—the very wavelengths commonly used for AESA systems. For example, such an undesired resonance can occur when the rings have a length of more than about half the order of the wavelength of RF signals transmitted and/or received by the microchip 16. Although such resonance typically has a low quality factor, it may couple paths between RF lines/pins/interfaces. The inventors overcame this problem by appropriately RF grounding the two rings 32.

Figure 3A:
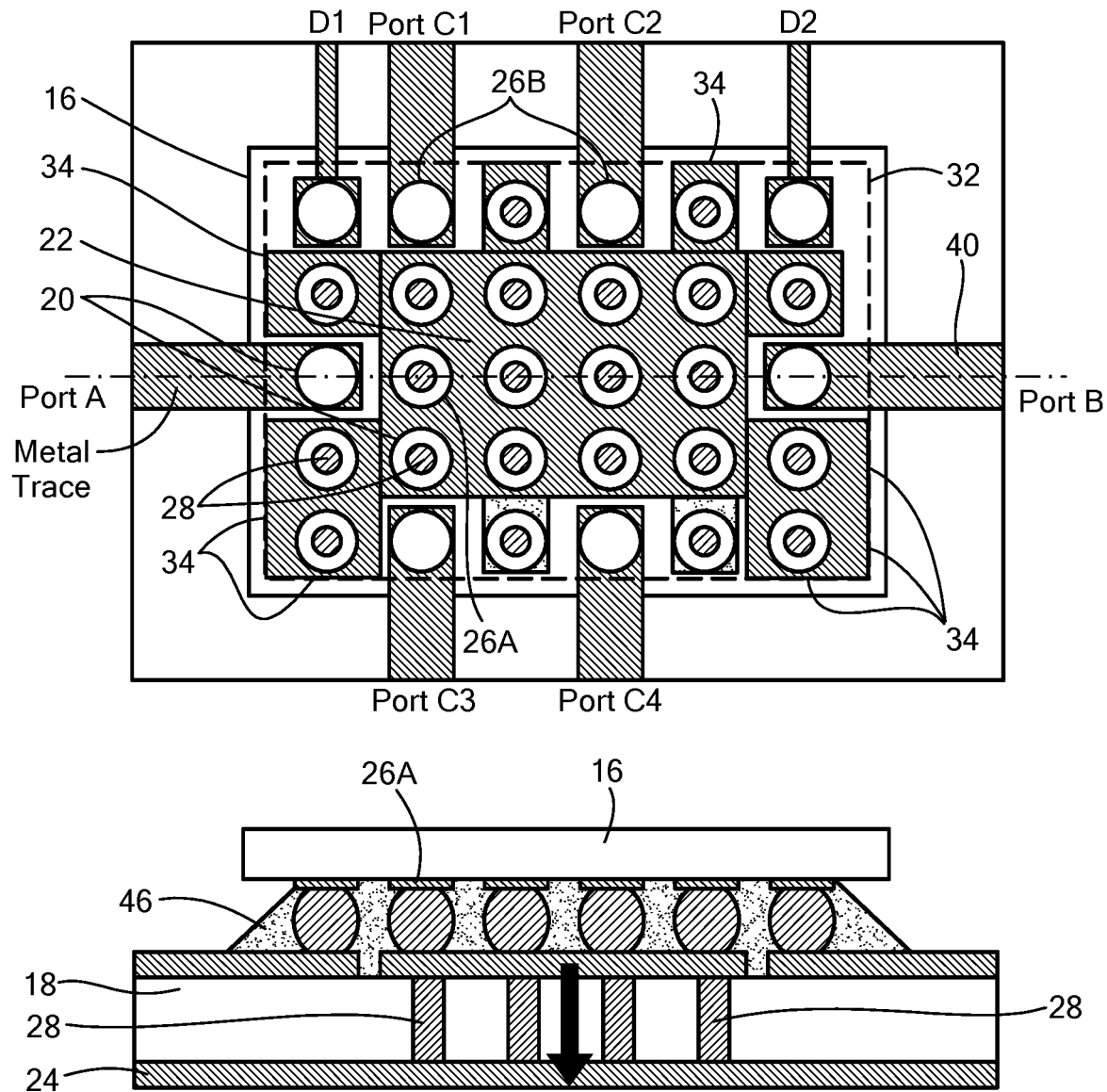
FIG. 3A schematically shows a plan view of another AESA microchip having wafer level package, as well as a cross-sectional view of the same microchip flip-chip mounted on a printed circuit board, in accordance with yet another embodiment of the invention.

FIG. 3A schematically shows one embodiment in which the seal ring 32 and the crackstop ring 32 both are RF grounded. To that end, a plurality of the ground pads 26A of the microchip 16 are electrically connected directly to the two rings 32. In illustrative embodiments, metal 34 on the bottom surface of the microchip 16 makes that electrical connection. FIG. 3A shows some of those connections at various locations using reference number 34. One skilled in the art can select the appropriate locations for grounding each of the rings 32 to ensure that in addition to being DC grounded, each of the rings 32 is RF grounded. In this example, each of the rings 32 is RF grounded on one or more points along each of its sides (assuming the ring 32 is rectangular in shape). For example, the locations can be spaced apart from each other in equidistant and non-equidistant points from between 0.1 times and 2.0 times the wavelength of the RF signals of the microchip 16. As noted, this preferably eliminates or mitigates parasitic resonances caused by the rings 32.

Rather than using the direct RF grounding of FIG. 3A, other embodiments may RF ground the rings 32 with other techniques. For example, some embodiments may capacitively couple the ring(s) to one or more of the lines, such as the digital lines D1, D2.

It should be noted that FIG. 3A shows the microchip system 14 as having both the thermal benefits of FIG. 2, as well as the interference mitigation benefits immediately discussed above. Various embodiments, however, may implement the microchip system 14 with just one of those improvements. For example, the microchip system 14 may have just the improvement for mitigating interference (e.g., an appropriate RF grounding with a GSG pad arrangement). As another example, the microchip system 14 may have just the improvement for improving thermal performance. Accordingly, while the microchip system 14 of FIG. 3A may have an improved overall performance because it implements the two noted improvements, those skilled in the art can select one of those improvements.

Figure 3B:
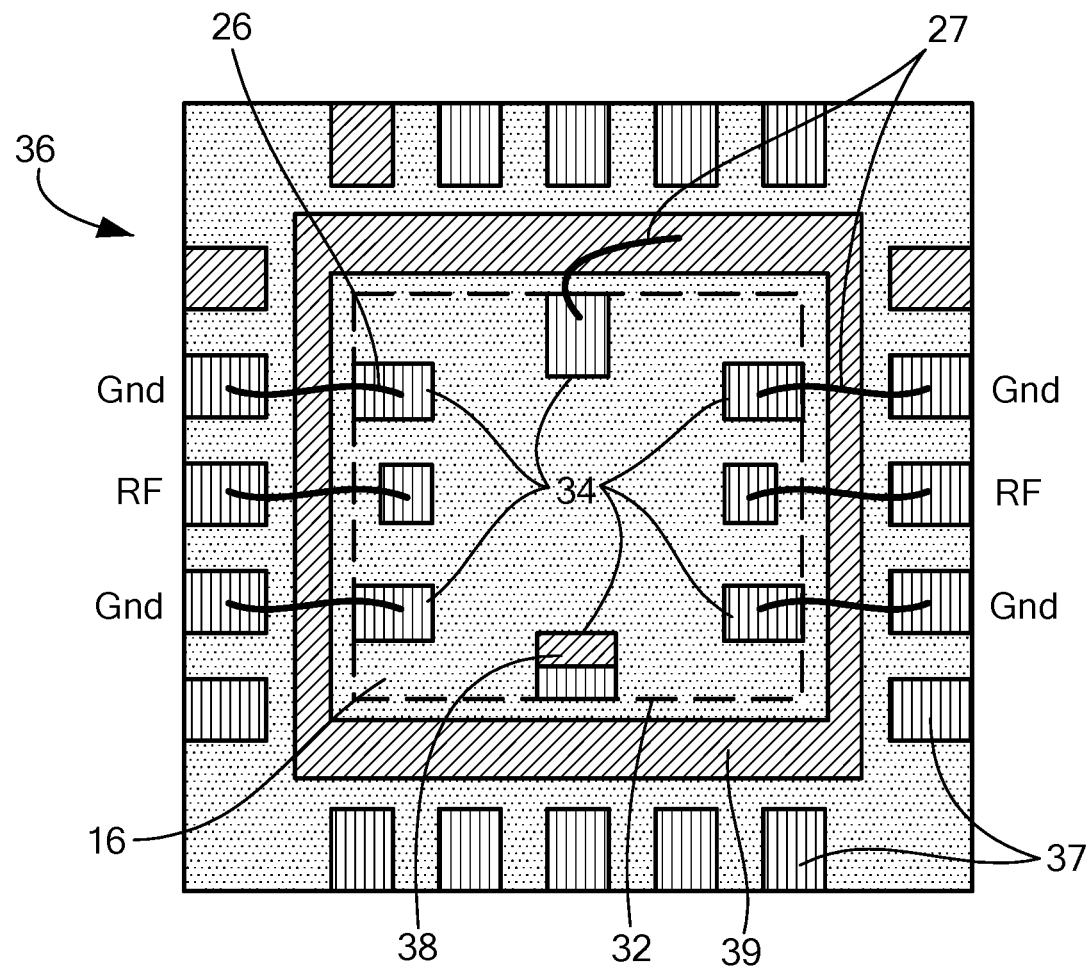
FIG. 3B schematically shows a plan view of the top of an AESA microchip system having a package level package (e.g., using a surface mount package) and implementing illustrative embodiments of the invention.

Various embodiments also apply to microchip systems 14 that are not packaged at the wafer level. FIG. 3B, for example, shows another embodiment that RF grounds the ring(s) using a package level package having package pads 37. In this example, the package is a quad flat no-leads package ("QFN package 36"). As known by those in the art, a QFN package 36 is a surface mountable package in which the microchip 16 is coupled with a conductive leadframe.

Specifically, FIG. 3B schematically shows a top view of a packaged microchip 16 (microchip system 14) with a portion of package encapsulation material removed to better view the microchip 16. As with the microchip 16 of FIG. 3A, this microchip 16 also has one or more seal rings 32 and/or crackstop rings 32, a plurality of ground pads 26A, and a plurality of signal pads 26B. In a corresponding manner, the package has a leadframe forming ground pads 26A and signal pads 26B. Bond wires 27 electrically connect 1) the ground pads 26A of the microchip 16 to the ground pads 26A of the package, and 2) the signal pads 26B of the microchip 16 to the signal pads of the package. The microchip system 14 has a plurality of other elements (some labeled in the drawing), such as through silicon vias 28, a molded body, and a die paddle/ground paddle 39 to which the microchip 16 may be coupled.

In accordance with illustrative embodiments, and as with the embodiment of FIG. 3A, select ground pads 26A are extended radially outwardly (e.g., using metal 34 on the microchip 16) to electrically and physically contact one or both of the rings 32. FIG. 3B shows some of those metal connection locations at reference number 34. One skilled in the art can select the appropriate locations to provide the RF ground. As suggested above, the connections preferably are spaced apart at much smaller intervals than about half the wavelength of anticipated signals to be transmitted and/or received. Bond wires 27 electrically connect each of those selected ground pads 26A with a ground source, such as the die paddle of the package and/or one of the ground pads 26A of the package.

Structure other than or in addition to the microchip ground pads 26A can also RF ground one or both of the rings 32. FIG. 3B, for example, also shows a through-silicon via ("TSV 38"), on the microchip 16, coupled with ground (e.g., though the die paddle) that connects one or both of the rings 32 to ground. Although only one such TSV 38 connection is shown, those skilled in the art can use two or more as required by the application.

Indeed, although QFN packages 36 are discussed above, various embodiments apply to other types of packages used to protect microchips on the package level. For example, in addition to flat packages, illustrative embodiments also may apply to microchip systems 14 using through-hole packages and chip carriers. Accordingly, discussion of QFN packages 36 is merely an example and not intended to limit all embodiments.

Figure 4:
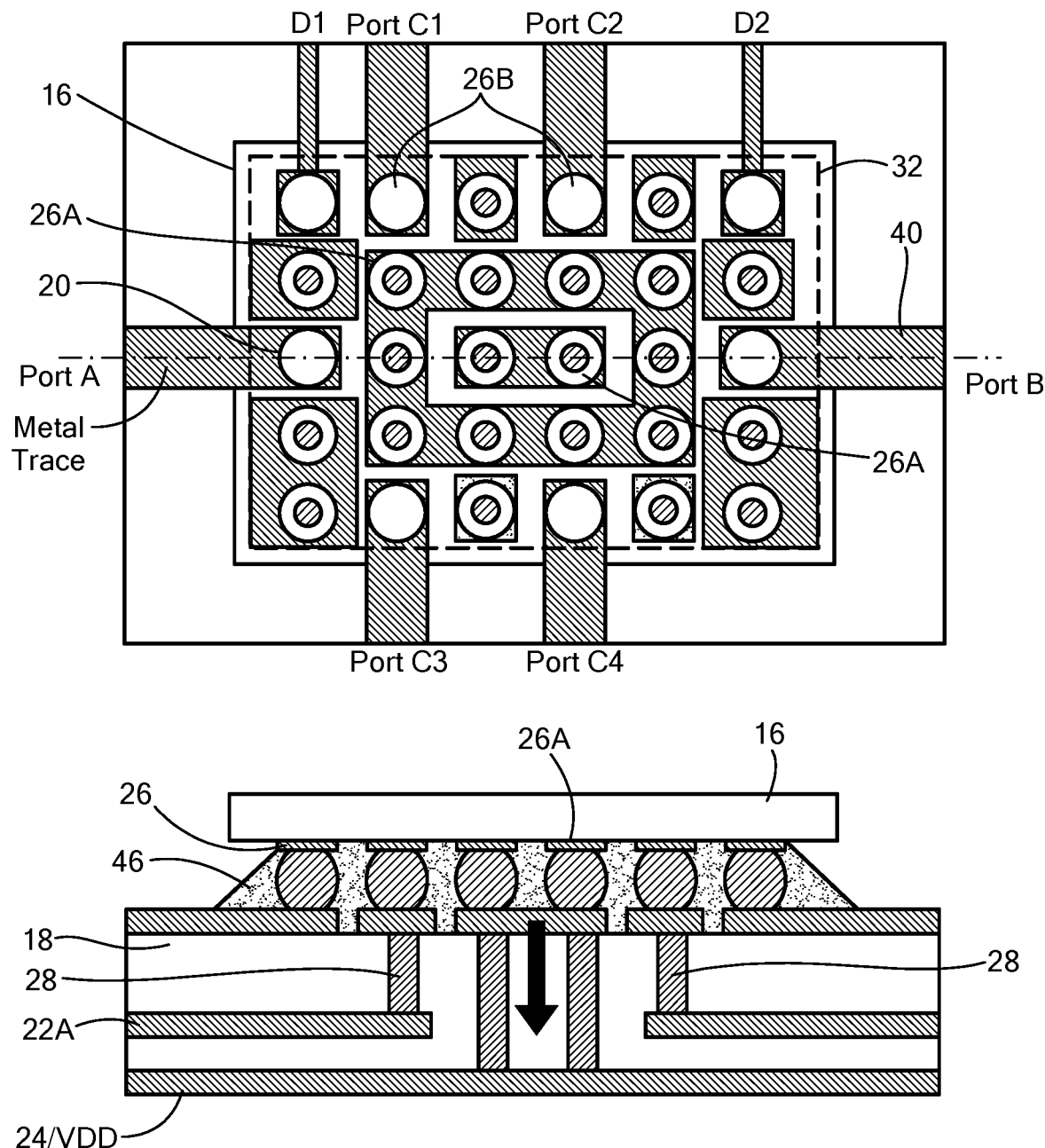
FIG. 4 schematically shows a plan view of an alternative AESA microchip having a wafer level package, as well as a cross-sectional view of the same microchip flip-chip mounted on a printed circuit board, in accordance with yet another embodiment of the invention FIG. 5 schematically shows several transmission line structures that may be used with various embodiments of the invention.

FIG. 4 schematically shows another embodiment using another type of static interface/pad to manage the thermal profile of the microchip 16. More specifically, the inner ground pads 26A circumscribe a plurality of other static interface pads 26A that also provide the noted thermal benefit. This arrangement thus uses two separate thermal paths that each leads to two separate heat spreading planes on the PCB. In addition, this arrangement also enables some pads used as ground pads 26A in FIG. 3A now to be used as input voltage pads 26A. Accordingly, such an arrangement should enable a pin count reduction and enable use of a smaller microchip/package.

As shown, this plurality of other interface pads 26A may be considered to form an island of/another set of other pads 26A. Specifically, in this embodiment, the other plurality of interface pads 26A are input voltage pads 26A (e.g., Vdd). Indeed, these two sets of pads 26A are electrically isolated from each other, and preferably are positioned as close to each other as possible to minimize the footprint of the microchip 16 while increasing the number of pads 26A used to provide the noted thermal benefit.

As shown in the lower view of FIG. 4, vias 28 thermally extend from the PCB input voltage pads 26A to the heat sink 24. The inner ground pads 26A (i.e., radially outward of the input voltage pads 26A), however, connect to another metal sheet 22A within the printed circuit board 18 that ultimately also acts as a heat sink or heat spreader. Accordingly, as with the embodiment of FIG. 2, both the inner ground pads 26A and input voltage pads 26A effectively conduct heat away from the functional elements of the microchip 16.

Other embodiments may orient the two sets of pads 26A of FIG. 4—the inner ground pads 26A and the input voltage pads 26A—in an opposite manner. Specifically, other embodiments may have a plurality of inner input voltage pads 26A that circumscribe a plurality of inner ground pads 26A. In other words, the arrangement of FIG. 4 may simply substitute the inner ground pads 26A with input voltage pads 26A, and substitute the inner voltage pads 26A with inner ground pads 26A.

Figure 5:
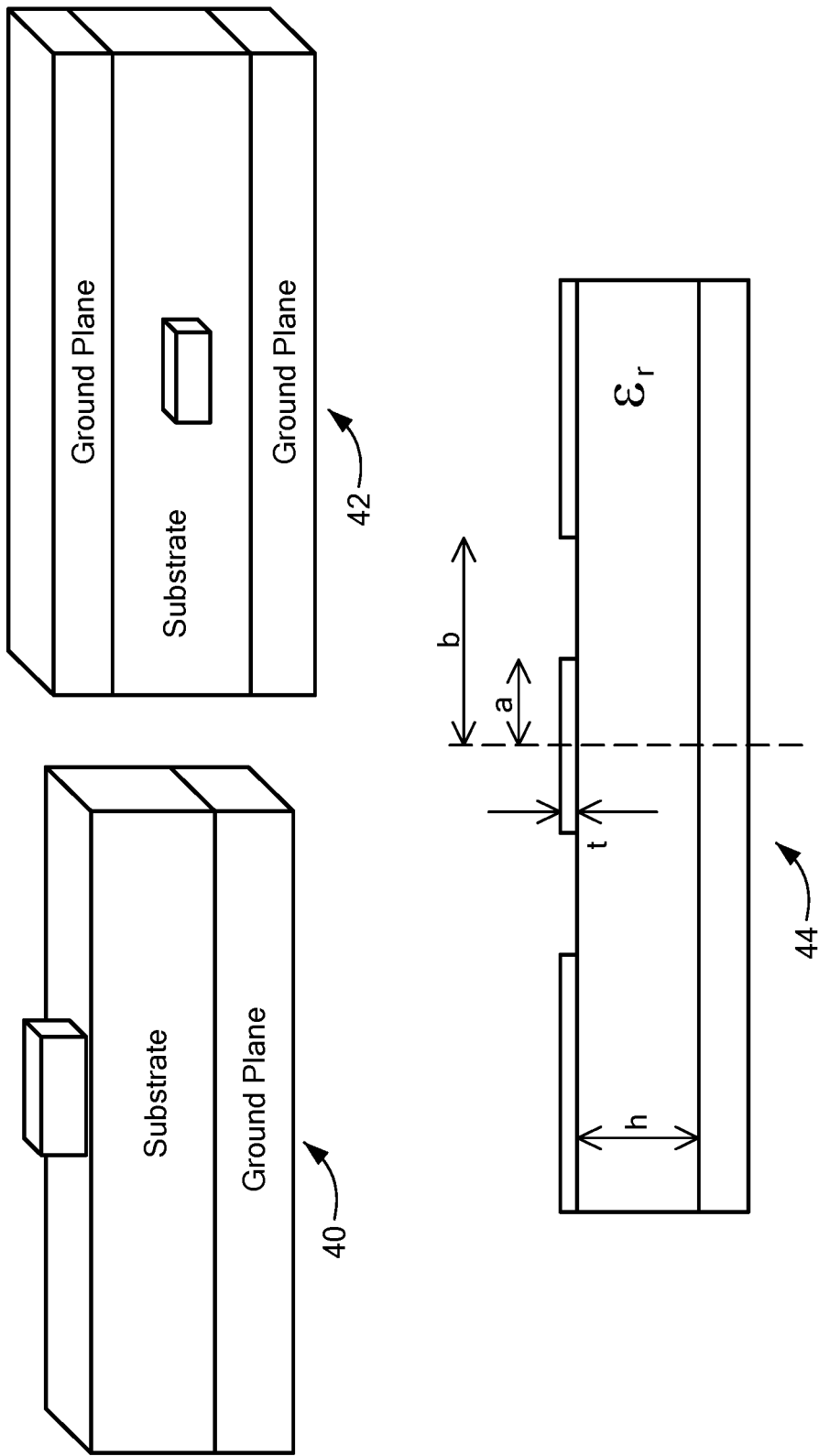

Those skilled in the art may use any of a variety of different transmission structures with the microchip system 14. FIG. 5, For example, schematically shows several transmission line structures that may be used with various embodiments of the invention. Specifically, those different transmission line structures may include a micros trip 40, a strip line 42, and/or a coplanar waveguide 44 (CPW). Of course, those in the art may select transmission line structures other than those shown.

Figure 6:
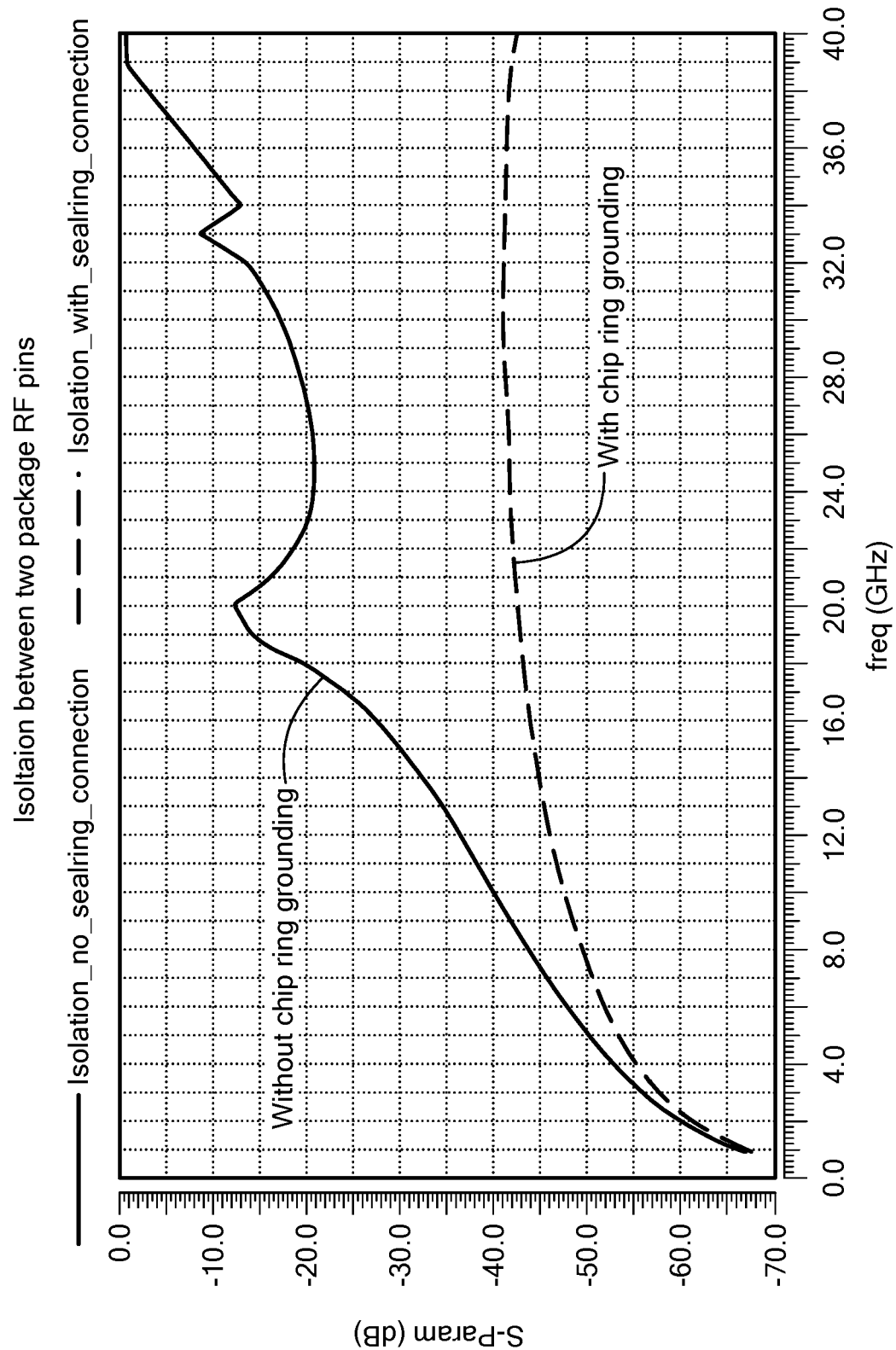
FIG. 6 graphically shows simulation data of the projected performance of various embodiments that RF ground the seal ring and crackstop ring. This performance is compared with systems that do not RF ground those rings.

The inventors simulated an embodiment of the invention that RF grounded the rings 32 to determine the RF isolation between the ports identified in FIG. 3A as "Port A" and "Port B." This was compared with a similar microchip device that did not RF ground the rings 32. FIG. 6 shows the output of that simulation. Specifically, FIG. 6 shows the amount of isolation between the ports as a function of frequency for the two compared microchips. In this graph, −70 dB is the most favorable isolation, while zero dB is the least favorable isolation. As shown, the simulated RF grounded microchip 16 with RF grounded ring(s) appears to have an isolation of less than about −40.0 dB across all frequencies of between zero and 40 GHz. In contrast, the simulated microchip without the RF grounded ring(s) is effectively unusable at about 40 GHz, and appears to have significantly more interference at frequencies greater than about 8 to 10 GHz.

To form the system, a fabrication method may simply flip-chip mount the microchip 16 on the printed circuit board 18 using conventional flip-chip techniques. This may include forming the solder balls 20 over the vias 28 on the printed circuit board 18, adding under-fill material 46, placing the microchip 16 on the solder balls 20, and then placing the printed circuit board 18 in a re-flow oven. In illustrative embodiments, when secured together, the flip-chip mounting forms a conductive thermal connection extending from:
  the RF circuitry, through the static pads 26A/interfaces (e.g., the centrally located static pads 26A/interfaces of the microchip 16, such as the power pads 26A or ground pads 26A),
  the solder balls 20,
  the vias 28 in the printed circuit board 18, and
  ultimately to the heat sink 24 or spreader.

Accordingly, illustrative embodiments position static pads 26A on the microchip 16 and printed circuit board metal 22 to better thermally manage a flip-chip microchip system 14. In addition or alternatively, other embodiments may RF ground the seal ring 32 and/or crackstop ring 32 and employ a GSG pad arrangement to mitigate cross-talk and interference between high-speed RF microchips 16 having multiple signal interfaces.

Although the above discussion discloses various exemplary embodiments of the invention, it should be apparent that those skilled in the art can make various modifications that will achieve some of the advantages of the invention without departing from the true scope of the invention.

What is claimed is:

1. A beamforming integrated circuit system for use in a phased array, the integrated circuit system comprising:
  a microchip having radio frequency (RF) circuitry, a bottom surface, and a plurality of interfaces, at least one of the plurality of interfaces electrically connected with the RF circuitry, the plurality of interfaces including a plurality of static interfaces and a plurality of RF interfaces; and
  a heat sink conductively thermally coupled with the plurality of static interfaces of the microchip,
  the plurality of static interfaces being on the bottom surface of the microchip and adjacent to each other,
  the plurality of RF interfaces being on the bottom surface of the microchip and radially outward of the plurality of static interfaces,
  the microchip being configured to be flip chip mounted; and
  a material ring circumscribing the static interfaces and the RF interfaces, and a plurality of RF ground paths coupled with the material ring.

2. The beamforming integrated circuit system as defined by claim 1 wherein the plurality of static interfaces forms a two dimensional array of static interfaces.

3. The beamforming integrated circuit system as defined by claim 1 wherein the microchip has an edge, the plurality of RF interfaces being between the edge and the plurality of static interfaces.

4. The beamforming integrated circuit system as defined by claim 3 wherein the plurality of RF interfaces are adjacent to the edge of the microchip.

5. The beamforming integrated circuit system as defined by claim 1 wherein the plurality of static interfaces comprises a plurality of ground interfaces.

6. The beamforming integrated circuit system as defined by claim 1 wherein the plurality of static interfaces comprises a plurality of power interfaces.

7. The beamforming integrated circuit system as defined by claim 1 wherein the plurality of RF interfaces circumscribe the plurality of static interfaces.

8. The beamforming integrated circuit system as defined by claim 1 further comprising a first ground interface and a second ground interface, the plurality of RF interfaces including a given RF interface with a first side and a second side, the first ground interface being adjacent to the first side of the given RF interface, the second ground interface being adjacent to the second side of the given RF interface.

9. The beamforming integrated circuit system as defined by claim 1 further comprising a printed circuit board with a top surface having an exposed metal layer conductively thermally coupled to a plurality of vias, the microchip being flip-chip mounted to the printed circuit board onto the exposed metal layer to couple the plurality of ground interfaces with the plurality of vias in the printed circuit board.

10. The beamforming integrated circuit system as defined by claim 9 wherein the heat sink is coupled with the printed circuit board and conductively thermally coupled with the plurality of static interfaces of the microchip through the plurality of vias, the exposed metal layer forming a thermal mass to conduct heat from the microchip toward the heat sink.

11. The beamforming integrated circuit system as defined by claim 1 wherein the microchip has an edge, further wherein all RF interfaces on the microchip are adjacent to the edge of the microchip.

12. The beamforming integrated circuit system as defined by claim 1 wherein the RF circuitry operates at between about 5 GHz and 300 GHz.

13. A beamforming system comprising:
a printed circuit board with a top surface having a metal layer, the printed circuit board also having a plurality of vias conductively thermally coupled with the metal layer;
a microchip having high frequency radio frequency (RF) circuitry, an edge, and a bottom surface, the microchip being flip-chip mounted with the top surface of the printed circuit board; and
a heat sink coupled with the printed circuit board,
the bottom surface of the microchip having a plurality of interfaces, at least one of the plurality of interfaces electrically connected with the RF circuitry, the plurality of interfaces including a plurality of static interfaces and a plurality of RF interfaces, the plurality of RF interfaces electrically connected with the RF circuitry,
the plurality of static interfaces being adjacent to each other,
the plurality of RF interfaces being adjacent to the edge of the microchip,
the plurality of static interfaces being conductively thermally coupled with the RF circuitry, the metal layer, and the plurality of vias, and
the heat sink being conductively thermally coupled with the plurality of static interfaces of the microchip through the plurality of vias in the printed circuit board;
the beamforming system further comprising a material ring circumscribing the static interfaces and the RF interfaces, and a plurality of RF ground paths coupled with the material ring.

14. The beamforming system as defined by claim 13 wherein the plurality of static interfaces forms a two dimensional array of static interfaces.

15. The beamforming system as defined by claim 13 wherein the plurality of static interfaces comprises a plurality of ground interfaces or power interfaces.

16. The beamforming system as defined by claim 13 wherein the plurality of RF interfaces circumscribe the plurality of static interfaces.

17. The beamforming system as defined by claim 13 wherein all RF interfaces on the microchip are adjacent to the edge of the microchip.

18. A method of forming a radio frequency (RF) beamforming system comprising:
providing a printed circuit board with a top surface having a metal layer, the printed circuit board also having a plurality of vias conductively thermally coupled with the metal layer; and
flip-chip mounting a microchip on the printed circuit board, the microchip having high frequency RF circuitry, an edge, and a bottom surface, the bottom surface of the microchip having a plurality of interfaces, at least one of the plurality of interfaces electrically connected with the RF circuitry, the plurality of interfaces including a plurality of static interfaces and a plurality of RF interfaces, the microchip having a material ring circumscribing the static interfaces and the RF interfaces, and a plurality of RF ground paths coupled with the material ring; and
coupling a heat sink to the printed circuit board to be conductively thermally coupled with the plurality of static interfaces of the microchip through the plurality of vias in the printed circuit board,
the plurality of static interfaces being adjacent to each other,
the plurality of RF interfaces being adjacent to the edge of the microchip,
flip-chip mounting comprising conductively thermally coupling the plurality of static interfaces with the RF circuitry, the metal layer, and the plurality of vias to form a conductive thermal path configured to conduct heat from the microchip during use.

19. The method as defined by claim 18 wherein the plurality of static interfaces forms a two dimensional array of static interfaces.

20. The method as defined by claim 18 wherein the plurality of static interfaces comprises a plurality of ground interfaces or power interfaces.

* * * * *